(12) United States Patent
Forbes

(10) Patent No.: US 8,823,006 B2
(45) Date of Patent: Sep. 2, 2014

(54) NANOFIN TRANSISTORS WITH CRYSTALLINE SEMICONDUCTOR FINS

(71) Applicant: Micron Technology, Inc., Boise, ID (US)

(72) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/723,838

(22) Filed: Dec. 21, 2012

(65) Prior Publication Data

US 2013/0112982 A1    May 9, 2013

Related U.S. Application Data

(62) Division of application No. 11/397,358, filed on Apr. 4, 2006, now Pat. No. 8,354,311.

(51) Int. Cl.
*H01L 29/78* (2006.01)
(52) U.S. Cl.
USPC ............................................................ 257/66
(58) Field of Classification Search
CPC ................ H01L 29/78; H01L 29/7827; H01L 29/66666; H01L 29/0673; B82Y 10/00
USPC ............................................................. 257/66
See application file for complete search history.

(56) References Cited

U.S. PATENT DOCUMENTS

| | | |
|---|---|---|
| 4,941,026 A | 7/1990 | Temple |
| 5,013,680 A | 5/1991 | Lowrey et al. |
| 5,545,586 A | 8/1996 | Koh |
| 5,646,900 A | 7/1997 | Tsukude et al. |
| 5,909,618 A | 6/1999 | Forbes et al. |
| 5,982,162 A | 11/1999 | Yamauchi |
| 6,063,688 A | 5/2000 | Doyle et al. |
| 6,097,065 A | 8/2000 | Forbes et al. |

(Continued)

FOREIGN PATENT DOCUMENTS

| | | |
|---|---|---|
| CN | 101410961 B | 9/2012 |
| DE | 19943390 A1 | 5/2001 |

(Continued)

OTHER PUBLICATIONS

"U.S. Appl. No. 11/397,358, 312 Amendment filed Dec. 11, 2012", 3 pgs.

(Continued)

*Primary Examiner* — Walter H Swanson
(74) *Attorney, Agent, or Firm* — Schwegman Lundberg & Woessner, P.A.

(57) ABSTRACT

One aspect of the present subject matter relates to a method for forming a transistor. According to an embodiment, a fin is formed from a crystalline substrate. A first source/drain region is formed in the substrate beneath the fin. A surrounding gate insulator is formed around the fin. A surrounding gate is formed around the fin and separated from the fin by the surrounding gate insulator. A second source/drain region is formed in a top portion of the fin. Various embodiments etch a hole in a layer over the substrate, form sidewall spacers in the hole, form a fin pattern from the sidewall spacers, and etch into the crystalline substrate to form the fin from the substrate using a mask corresponding to the fin pattern. Other aspects are provided herein.

20 Claims, 13 Drawing Sheets

(56) References Cited

U.S. PATENT DOCUMENTS

| | | |
|---|---|---|
| 6,104,061 A | 8/2000 | Forbes et al. |
| 6,104,068 A | 8/2000 | Forbes |
| 6,150,687 A | 11/2000 | Noble et al. |
| 6,177,299 B1 | 1/2001 | Hsu et al. |
| 6,191,448 B1 | 2/2001 | Forbes et al. |
| 6,238,976 B1 | 5/2001 | Noble et al. |
| 6,320,222 B1 | 11/2001 | Forbes et al. |
| 6,350,635 B1 | 2/2002 | Noble et al. |
| 6,355,961 B1 | 3/2002 | Forbes |
| 6,376,317 B1 | 4/2002 | Forbes et al. |
| 6,377,070 B1 | 4/2002 | Forbes |
| 6,399,979 B1 | 6/2002 | Noble et al. |
| 6,413,802 B1 | 7/2002 | Hu et al. |
| 6,413,825 B1 | 7/2002 | Forbes |
| 6,414,356 B1 | 7/2002 | Forbes et al. |
| 6,424,001 B1 | 7/2002 | Forbes et al. |
| 6,448,601 B1 | 9/2002 | Forbes et al. |
| 6,492,233 B2 | 12/2002 | Forbes et al. |
| 6,496,034 B2 | 12/2002 | Forbes et al. |
| 6,504,201 B1 | 1/2003 | Noble et al. |
| 6,531,727 B2 | 3/2003 | Forbes et al. |
| 6,559,491 B2 | 5/2003 | Forbes et al. |
| 6,566,682 B2 | 5/2003 | Forbes |
| 6,639,268 B2 | 10/2003 | Forbes et al. |
| 6,649,476 B2 | 11/2003 | Forbes |
| 6,653,174 B1 | 11/2003 | Cho et al. |
| 6,664,806 B2 | 12/2003 | Forbes et al. |
| 6,720,216 B2 | 4/2004 | Forbes |
| 6,747,313 B1 | 6/2004 | Gil |
| 6,762,448 B1 | 7/2004 | Lin et al. |
| 6,801,056 B2 | 10/2004 | Forbes |
| 6,818,937 B2 | 11/2004 | Noble et al. |
| 6,855,582 B1 | 2/2005 | Dakshina-Murthy et al. |
| 6,881,627 B2 | 4/2005 | Forbes et al. |
| 6,890,812 B2 | 5/2005 | Forbes et al. |
| 6,894,532 B2 | 5/2005 | Forbes et al. |
| 6,903,367 B2 | 6/2005 | Forbes |
| 6,946,879 B2 | 9/2005 | Forbes |
| 6,964,903 B2 | 11/2005 | Forbes |
| 7,120,046 B1 | 10/2006 | Forbes |
| 7,326,611 B2 | 2/2008 | Forbes |
| 7,371,627 B1 | 5/2008 | Forbes |
| 7,425,491 B2 | 9/2008 | Forbes et al. |
| 7,439,576 B2 | 10/2008 | Forbes |
| 7,446,372 B2 | 11/2008 | Forbes |
| 7,491,995 B2 | 2/2009 | Forbes |
| 7,547,947 B2 * | 6/2009 | Anderson et al. ............ 257/369 |
| 8,062,949 B2 | 11/2011 | Forbes |
| 8,119,484 B2 | 2/2012 | Forbes |
| 8,134,197 B2 | 3/2012 | Forbes |
| 8,354,311 B2 | 1/2013 | Forbes |
| 2002/0028541 A1 | 3/2002 | Lee et al. |
| 2002/0060338 A1 | 5/2002 | Zhang |
| 2002/0177265 A1 | 11/2002 | Skotnicki |
| 2003/0006410 A1 | 1/2003 | Doyle |
| 2003/0008515 A1 | 1/2003 | Chen et al. |
| 2003/0227072 A1 | 12/2003 | Forbes et al. |
| 2004/0007721 A1 | 1/2004 | Forbes et al. |
| 2004/0108545 A1 | 6/2004 | Ando |
| 2004/0174734 A1 | 9/2004 | Forbes |
| 2004/0217391 A1 | 11/2004 | Forbes |
| 2004/0219722 A1 | 11/2004 | Pham et al. |
| 2004/0235243 A1 | 11/2004 | Noble et al. |
| 2005/0023616 A1 | 2/2005 | Forbes |
| 2005/0032297 A1 | 2/2005 | Kamins |
| 2005/0190617 A1 | 9/2005 | Forbes et al. |
| 2006/0043471 A1 | 3/2006 | Tang et al. |
| 2006/0046200 A1 | 3/2006 | Abatchev et al. |
| 2006/0046391 A1 | 3/2006 | Tang et al. |
| 2006/0046424 A1 | 3/2006 | Chance et al. |
| 2006/0063350 A1 | 3/2006 | Chance et al. |
| 2006/0076625 A1 | 4/2006 | Lee et al. |
| 2006/0258119 A1 | 11/2006 | Wells |
| 2006/0278910 A1 | 12/2006 | Forbes |
| 2007/0018206 A1 | 1/2007 | Forbes |
| 2007/0052012 A1 | 3/2007 | Forbes |
| 2007/0082448 A1 | 4/2007 | Kim et al. |
| 2007/0228433 A1 | 10/2007 | Forbes |
| 2007/0228491 A1 | 10/2007 | Forbes |
| 2007/0231980 A1 | 10/2007 | Forbes |
| 2007/0231985 A1 | 10/2007 | Forbes |
| 2007/0232007 A1 | 10/2007 | Forbes |
| 2008/0315279 A1 | 12/2008 | Forbes |
| 2009/0155966 A1 | 6/2009 | Forbes |
| 2010/0055917 A1 | 3/2010 | Kim |
| 2010/0330759 A1 | 12/2010 | Forbes |
| 2012/0119279 A1 | 5/2012 | Forbes |
| 2012/0168855 A1 | 7/2012 | Forbes |

FOREIGN PATENT DOCUMENTS

| | | |
|---|---|---|
| EP | 2002468 B1 | 7/2013 |
| JP | 03218679 A | 9/1991 |
| JP | 05160408 A | 6/1993 |
| JP | 5198817 A | 8/1993 |
| JP | 05198817 A | 8/1993 |
| JP | 06053513 A | 2/1994 |
| JP | 07302914 A | 11/1995 |
| JP | 08032062 A | 2/1996 |
| JP | 10229175 A | 5/1998 |
| JP | 2003124476 A | 4/2003 |
| JP | 2004356314 A | 12/2004 |
| JP | 2004538642 A | 12/2004 |
| JP | 2005039290 A | 2/2005 |
| JP | 2005116969 A | 4/2005 |
| JP | 2005197704 A | 7/2005 |
| JP | 2006511962 A | 4/2006 |
| KR | 102000001758 A | 3/2000 |
| SG | 146344 | 5/2011 |
| TW | I344181 | 6/2011 |
| TW | I349970 B | 10/2011 |
| TW | I357112 | 1/2012 |
| WO | WO-03015171 A1 | 2/2003 |
| WO | WO-2004061972 A1 | 7/2004 |
| WO | WO-2005079182 A2 | 9/2005 |
| WO | WO-2005079182 A3 | 9/2005 |
| WO | WO-2007114927 A1 | 10/2007 |
| WO | WO-2007120492 A1 | 10/2007 |
| WO | WO-2007120493 A1 | 10/2007 |
| WO | WO-2007136461 A2 | 11/2007 |
| WO | WO-2007136461 A3 | 11/2007 |

OTHER PUBLICATIONS

"U.S. Appl. No. 11/397,358, Advisory Action mailed Jan. 15, 2010", 3 pgs.

"U.S. Appl. No. 11/397,358, Appeal Brief filed Mar. 26, 2012", 20 pgs.

"U.S. Appl. No. 11/397,358, Examiner Interview Summary mailed Aug. 20, 2012", 2 pgs.

"U.S. Appl. No. 11/397,358, Examiner Interview Summary mailed Nov. 28, 2012", 2 pgs.

"U.S. Appl. No. 11/397,358, Examiner Interview Summary mailed Dec. 19, 2012", 3 pgs.

"U.S. Appl. No. 11/397,358, Final Office Action mailed Oct. 19, 2009", 10 pgs.

"U.S. Appl. No. 11/397,358, Final Office Action mailed Oct. 26, 2011", 17 pgs.

"U.S. Appl. No. 11/397,358, Final Office Action mailed Nov. 10, 2010", 11 pgs.

"U.S. Appl. No. 11/397,358, Non Final Office Action mailed Mar. 13, 2009", 23 pgs.

"U.S. Appl. No. 11/397,358, Non Final Office Action mailed Apr. 7, 2011", 13 pgs.

"U.S. Appl. No. 11/397,358, Non Final Office Action mailed May 24, 2010", 14 pgs.

"U.S. Appl. No. 11/397,358, Notice of Allowance mailed Jul. 10, 2012", 11 pgs.

"U.S. Appl. No. 11/397,358, Response filed Feb. 5, 2009 to Restriction Requirement mailed Jan. 7, 2009", 8 pgs.

"U.S. Appl. No. 11/397,358, Response filed Feb. 10, 2011 to Final Office Action mailed Nov. 30, 2010", 11 pgs.

(56) References Cited

OTHER PUBLICATIONS

"U.S. Appl. No. 11/397,358, Response filed Jun. 11, 2009 to Non Final Office Action mailed Mar. 13, 2009", 12 pgs.
"U.S. Appl. No. 11/397,358, Response filed Aug. 8, 2011 to Non Final Office Action mailed Apr. 7, 2011", 13 pgs.
"U.S. Appl. No. 11/397,358, Response filed Aug. 24, 2010 to Non Final Office Action mailed Jun. 24, 2010", 13 pgs.
"U.S. Appl. No. 11/397,358, Response filed Oct. 13, 2008 to Restriction Requirement mailed Sep. 15, 2008", 8 pgs.
"U.S. Appl. No. 11/397,358, Response filed Dec. 21, 2009 to Final Office Action mailed Oct. 19, 2009", 10 pgs.
"U.S. Appl. No. 11/397,358, Restriction Requirement mailed Jan. 7, 2009", 6 pgs.
"U.S. Appl. No. 11/397,358, Restriction Requirement mailed Sep. 15, 2008", 7 pgs.
"U.S. Appl. No. 11/397,406, Advisory Action mailed Sep. 24, 2008", 3 pgs.
"U.S. Appl. No. 11/397,406, Examiner Interview Summary mailed Oct. 23, 2008", 2 pgs.
"U.S. Appl. No. 11/397,406, Final Office Action mailed Jul. 1, 2009", 16 pgs.
"U.S. Appl. No. 11/397,406, Final Office Action mailed Jul. 18, 2008", 8 pgs.
"U.S. Appl. No. 11/397,406, Non Final Office Action mailed Jan. 24, 2008", 7 pgs.
"U.S. Appl. No. 11/397,406, Non Final Office Action mailed Dec. 16, 2008", 14 pgs.
"U.S. Appl. No. 11/397,406, Response filed Mar. 16, 2009 to Non Final Office Action mailed Dec. 16, 2008", 10 pgs.
"U.S. Appl. No. 11/397,406, Response filed Apr. 24, 2008 to Non Final Office Action mailed Jan. 24, 2008", 12 pgs.
"U.S. Appl. No. 11/397,406, Response filed Sep. 15, 2008 to Final Office Action mailed Jul. 18, 2008", 12 pgs.
"U.S. Appl. No. 11/397,406, Response filed Oct. 17, 2008 to Advisory Action mailed Sep. 24, 2008", 9 pgs.
"U.S. Appl. No. 11/397,406, Response filed Nov. 19, 2007 to Restriction Requirement mailed Oct. 18, 2007", 9 pgs.
"U.S. Appl. No. 11/397,406, Restriction Requirement mailed Oct. 18, 2007", 7 pgs.
"U.S. Appl. No. 11/397,413, Ex Parte Quayle Action mailed Aug. 5, 2008", 6 pgs.
"U.S. Appl. No. 11/397,413, Non-Final Office Action mailed Feb. 11, 2008", 18 pgs.
"U.S. Appl. No. 11/397,413, Notice of Allowance mailed Oct. 8, 2008", 8 pgs.
"U.S. Appl. No. 11/397,413, Response filed May 12, 2008 to Non Final Office Action mailed Feb. 11, 2008", 11 pgs.
"U.S. Appl. No. 11/397,413, Response filed Nov. 7, 2007 to Restriction Requirement mailed Oct. 5, 2007", 11 pgs.
"U.S. Appl. No. 11/397,413, Response filed Sep. 19, 2008 to Ex Parte Quayle Action mailed Aug. 5, 2008", 9 pgs.
"U.S. Appl. No. 11/397,413, Response to Ex Parte Quayle Action filed Sep. 19, 2008", 9 pgs.
"U.S. Appl. No. 11/397,413, Restriction Requirement mailed Oct. 5, 2007", 6 pgs.
"U.S. Appl. No. 11/397,430, Advisory Action mailed Mar. 19, 2010", 3 pgs.
"U.S. Appl. No. 11/397,430, Final Office Action mailed Dec. 31, 2009", 11 pgs.
"U.S. Appl. No. 11/397,430, Non Final Office Action mailed May 29, 2009", 9 pgs.
"U.S. Appl. No. 11/397,430, Response filed Feb. 25, 2010 to Final Office Action mailed Dec. 31, 2009", 9 pgs.
"U.S. Appl. No. 11/397,430, Response filed Mar. 6, 2009 to Restriction Requirement mailed Feb. 5, 2009", 7 pgs.
"U.S. Appl. No. 11/397,430, Response filed Aug. 31, 2009 to Non-Final Office Action mailed May 29, 2009", 10 pgs.
"U.S. Appl. No. 11/397,430, Restriction Requirement mailed Feb. 5, 2009", 8 pgs.
"U.S. Appl. No. 11/397,527, Final Office Action mailed Mar. 10, 2008", 15 pgs.
"U.S. Appl. No. 11/397,527, Final Office Action mailed Dec. 26, 2007", 14 pgs.
"U.S. Appl. No. 11/397,527, Non-Final Office Action mailed Jul. 24, 2007", 17 pgs.
"U.S. Appl. No. 11/397,527, Notice of Allowance mailed May 15, 2008", 13 pgs.
"U.S. Appl. No. 11/397,527, Response filed Mar. 18, 2008 to Final Office Action mailed Mar. 10, 2008", 15 pgs.
"U.S. Appl. No. 11/397,527, Response filed May 25, 2007 to Restriction Requirement mailed Apr. 27, 2007", 11 pgs.
"U.S. Appl. No. 11/397,527, Response filed Oct. 24, 2007 to Non Final Office Action mailed Jul. 24, 2007", 16 pgs.
"U.S. Appl. No. 11/397,527, Restriction Requirement mailed Apr. 27, 2007", 5 pgs.
"U.S. Appl. No. 11/397,527, Supplemental Final Office Action mailed Mar. 10, 2008", 15 pgs.
"U.S. Appl. No. 12/192,618, Final Office Action mailed Mar. 8, 2010", 22 pgs.
"U.S. Appl. No. 12/192,618, Non-Final Office Action mailed Oct. 5, 2009", 13 pgs.
"U.S. Appl. No. 12/192,618, Notice of Allowance mailed Jan. 10, 2011", 6 pgs.
"U.S. Appl. No. 12/192,618, Notice of Allowance mailed May 13, 2011", 7 pgs.
"U.S. Appl. No. 12/192,618, Notice of Allowance mailed Jun. 24, 2010", 9 pgs.
"U.S. Appl. No. 12/192,618, Notice of Allowance mailed Nov. 4, 2011", 7 pgs.
"U.S. Appl. No. 12/192,618, Response filed Jan. 5, 2010 to Non Final Office Action mailed Oct. 5, 2009", 9 pgs.
"U.S. Appl. No. 12/192,618, Response filed May 10, 2010 to Final Office Action mailed Mar. 8, 2010", 13 pgs.
"U.S. Appl. No. 12/198,265, Notice of Allowance mailed Jul. 14, 2011", 11 pgs.
"U.S. Appl. No. 12/198,265, Response filed Mar. 28, 2011 to Restriction Requirement mailed Feb. 24, 2011", 9 pgs.
"U.S. Appl. No. 12/198,265, Restriction Requirement mailed Feb. 24, 2011", 7 pgs.
"U.S. Appl. No. 12/353,592, Advisory Action mailed Jan. 10, 2011", 3 pgs.
"U.S. Appl. No. 12/353,592, Final Office Action mailed Oct. 18, 2010", 14 pgs.
"U.S. Appl. No. 12/353,592, Non Final Office Action mailed Apr. 1, 2011", 10 pgs.
"U.S. Appl. No. 12/353,592, Non-Final Office Action mailed Apr. 29, 2010", 14 pgs.
"U.S. Appl. No. 12/353,592, Notice of Allowance mailed Oct. 13, 2011", 10 pgs.
"U.S. Appl. No. 12/353,592, Response filed Jul. 1, 2011 to Non Final Office Action mailed Apr. 1, 2011", 15 pgs.
"U.S. Appl. No. 12/353,592, Response filed Jul. 27, 2010 to Non Final Office Action mailed Apr. 29, 2010", 10 pgs.
"U.S. Appl. No. 12/353,592, Response filed Dec. 20, 2010 to Final Office Action mailed Oct. 18, 2010", 10 pgs.
"Chinese Application Serial No. 200780012174.8, Office Action mailed Feb. 14, 2012", w/ English Translation, 8 pgs.
"Chinese Application Serial No. 200780012174.8, Office Action mailed Mar. 1, 2010", with English translation, 8 pgs.
"Chinese Application Serial No. 200780012174.8, Office Action mailed Mar. 30, 2011", 4 pgs.
"Chinese Application Serial No. 200780012174.8, Office Action mailed Dec. 3, 2010", with English translation, 5 pgs.
"Chinese Application Serial No. 200780012174.8, Office Action response filed Jan. 28, 2011", (with English translation of amended claims), 12 pgs.
"Chinese Application Serial No. 200780012174.8, Response filed Apr. 26, 2012 to Office Action mailed Feb. 14, 2012", 16 pgs.
"Chinese Application Serial No. 200780012174.8, Response filed Aug. 16, 2012 to Office Action mailed Jul. 17, 2012", 14 pgs.
"Chinese Application Serial No. 200780012174.8, Response filed Feb. 10, 2011", (with English translation of amended claims), 13 pgs.

(56) References Cited

OTHER PUBLICATIONS

"European Application Serial No. 07754850.1, Office Action Mailed May 25, 2010", 6 pgs.
"European Application Serial No. 07754850.1, Office Action mailed Jun. 9, 2011", 5 pgs.
"European Application Serial No. 07754850.1, Office Action Response mailed Nov. 17, 2010", 19 pgs.
"European Application Serial No. 07754850.1, Response filed Oct. 17, 2011 to Office Action mailed Jun. 9, 2011", 13 pgs.
"International Application Serial No. PCT/US2007008400, International Search Report mailed Sep. 18, 2007", 4 pgs.
"International Application Serial No. PCT/US2007008400, Written Opinion mailed Sep. 18, 2007", 6 pgs.
"Japanese Application Serial No. 2009-504280, Amendment filed Mar. 31, 2010", with English translation, 15 pgs.
"Korean Application Serial No. 10-2008-7026973, Voluntary Amendment filed Mar. 20, 2012", Without English Translation, 2 pgs.
"Photolithography", [Online]. Retrieved from the Internet: <URL: http://web.archive.org/web/20020211230307/http://britneyspears.aclphysics/fabrication/photolithography.htm>, (Feb. 11, 2002), 3 pgs.
"Taiwanese Application Serial No. 96112125, Office Action mailed Dec. 2, 2010", with English translation of claims, 15 pgs.
"Taiwanese Application Serial No. 96112125, Response filed Jun. 6, 2011 to Office Action mailed Dec. 2, 2010", 33 pgs.
Adler, E., et al., "The Evolution of IBM CMOS DRAM Technology", IBM Journal of Research & Development, 39(1-2), (Jan.-Mar. 1995), 167-188.
Bryllert, Tomas, et al., "Vertical high mobility wrap-gated InAs nanowire transistor", IEEE Device Research Conference, Santa Barbara, CA, (Jun. 2005), 157-158.
Cho, Hyun-Jin, et al., "A Novel Pillar DRAM Cell for 4Gbit and Beyond", 1998 Symposium on VLSI Technology Digest of Technical Papers, Jun. 9-11, 1998, (Jun. 1998), 38-39.
Denton, Jack P., et al., "Fully depleted dual-gated thin-film SOI P-MOSFETs fabricated in SOI islands with an isolated buried polysilicon backgate", IEEE Electron Device Letters, 17(11), (Nov. 1996), 509-511.
Doyle, B. S., et al., "High performance fully-depleted tri-gate CMOS transistors", IEEE Electron Device Letters, vol. 24, No. 4, (Apr. 2003), 263-265.
Doyle, B. S., et al., "Tri-Gate fully-depleted CMIS transistors: fabrication, design and layout", 2003 Symposium on VLSI Technology Digest of Technical Papers, Kyoto, Japan, Jun. 10-12, 2003, (2003), 133-134.
Forbes, Leonard, "DRAM Arrays, Vertical Transistor Structures, and Methods of Forming Transistor Structures and DRAM Arrays", U.S. Appl. No. 11/051,119, filed Feb. 3, 2005, 52 pages.
Forbes, Leonard, "DRAM Tunneling Access Transistor", U.S. Appl. No. 11/219,085, filed Aug. 29, 2005, 31 pages.
Forbes, Leonard, "DRAM With Nanofin Transistors", 48 pgs.
Forbes, Leonard, "Grown Nanofin Transistors", 37 pgs.
Forbes, Leonard, "Memory Array With Surrounding Gate Access Transistors and Capacitors With Global and Staggered Local Bit Lines", U.S. Appl. No. 11/128,585, filed May 13, 2005, 42 pages.
Forbes, Leonard, "Memory Array With Ultra-Thin Etched Pillar Surround Gate Access Transistors and Buried Data/Bit Lines", U.S. Appl. No. 11/129,502, filed May 13, 2005, 33 pages.
Forbes, Leonard, "Nanowire Transistor With Surrounding Gate", (, 37 pgs.
Forbes, Leonard, "Surround Gate Access Transistors With Grown Ultra-Thin Bodies", U.S. Appl. No. 11/175,677, filed Jul. 6, 2005, 28 pages.
Forbes, Leonard, "Tunneling Transistor With Sublithographic Channel", 63 pgs.
Forbes, Leonard, "Ultra-Thin Body Vertical Tunneling Transistor", U.S. Appl. No. 11/215,468, filed Aug. 29, 2005, 27 pages.
Forbes, Leonard, "Vertical Transistor, Memory Cell, Device, System and Method of Forming Same", U.S. Appl. No. 11/151,219, filed Jun. 13, 2005, 39 pages.
Forbes, Leonard, "Vertical Tunneling Nano-Wire Transistor", U.S. Appl. No. 11/210,374, filed Aug. 24, 2005, 26 pages.
Huang, Xuejue, et al., "Sub-50 nm P-Channel FinFET", IEEE Transactions on Electron Devices, vol. 48, No. 5, (May 2001), 880-886.
Kalavade, Pranav, et al., "A novel sub-10 nm transistor", 58th DRC. Device Research Conference. Conference Digest, (Jun. 19-21, 2000), 71-72.
Kedzierski, Jakub, et al., "Threshold voltage control in NiSi-gated MOSFETs through silicidation induced impurity segregation (SIIS)", IEDM Tech. Dig., (2003), 315-318.
Kim, Keunwoo, et al., "Nanoscale CMOS Circuit Leakage Power Reduction by Double-Gate Device", International Symposium on Low Power Electronics and Design, Newport, CA, Aug. 9-11, 2004; http://www.islped.org, (2004), 102-107.
Lee, Choonsup, et al., "A Nanochannel Fabrication Technique without Nanolithography", Nano Letters, vol. 3, No. 10, (2003), 1339-1340.
Mitsutoshi, et al., "Excimer laser annealing of amorphous and solid-phase-crystallized silicon films.", Journal of Applied Physics, vol. 86, No. 10, (Nov. 15, 1999.), 10 pgs.
Miyano, Shinji, et al., "Numerical Analysis of a Cylindrical Thin-Pillar Transistor (CYNTHIA)", IEEE Transactions on Electron Devices, vol. 39, No. 8, (Aug. 1992), 1876-1881.
Nirschl, TH., et al., "The Tunneling Field Effect Transistor (TFET) as an Add-on for Ultra-Low-Voltage Analog and Digital Processes", IEEE International Electron Devices Meeting, 2004; IEDM Technical Digest, (Dec. 13-15, 2004), 195-198.
Rahman, Anisur, et al., "Theory of Ballistic Nanotransistors", IEEE Transactions on Electron Devices, vol. 50, No. 9, (Sep. 2003), 1853-1864.
Samuelson, L., et al., "Semiconductor nanowires for 0D and 1D physics and applications", Physica E 25, (Jul. 27, 2004), 313-318.
Samuelson, Lars, "Semiconductor Nanowires as a Novel Electronic Materials Technology for Future Electronic Devices", IEEE Device Research Conference, Santa Barbara, CA, (Jun. 2005), 245.
Shimomura, K., et al., "A 1-V 46-ns 16-Mb SOI-DRAM with body control technique", IEEE Journal of Solid-State Circuits, 32(11), (Nov. 1997), 1712-1720.
Shimomura, K., et al., "A 1V 46ns 16Mb SOI-DRAM with Body Control Technique", 1997 IEEE International Solid-State Circuits Conference, Digest of Technical Papers, (Feb. 6, 1997), 68-69.
Takato, H., et al., "High Performance CMOS Surrounding Gate Transistor (SGT) for Ultra High Density LSIs", IEEE International Electron Devices Meeting, Technical Digest, (1988), 222-225.
Wong, Hon-Sum Philip, et al., "Self-Aligned (Top and Bottom) Double-Gate MOSFET with a 25 nm Thick Silicon Channel", IEEE Int. Electron Device Meeting, (1997), 427-430.
Xuan, Peiqi, et al., "60nm Planarized Ultra-thin Body Solid Phase Epitaxy MOSFETs", IEEE Device Research Conference, Conference Digest. 58th DRC, (Jun. 19-21, 2000), 67-68.
Ziegler, James F., et al., "Cosmic Ray Soft Error Rates of 16-Mb DRAM Memory Chips", IEEE Journal of Solid-State Circuits, vol. 33, No. 2, (Feb. 1998), 246-252.
"Chinese Application Serial No. 200780012174.8, Office Action mailed Jul. 17, 2012", 4 pgs.
"Chinese Application Serial No. 200780012174.8, Office Action mailed Jun. 5, 2012", 4 pgs.
"European Application Serial No. 07809002.4, Office Action mailed Feb. 20, 2013", 7 pgs.
"European Application Serial No. 07809002.4, Response filed Jul. 1, 2013 to Examination Notification Art. 94(3) mailed Feb. 20, 2013", 14 pgs.
"International Application Serial No. PCT/US2007008400, International Preliminary Report on Patentability mailed Oct. 16, 2008", 8 pgs.
"International Search Report and Written Opinion mailed Aug. 21, 2007 in Application Serial No. PCT/US2007/008124", 11 pgs.
"Japanese Application Serial No. 2009-504280, Office Action mailed Oct. 9, 2012", With English Translation, 6 pgs.

(56) References Cited

OTHER PUBLICATIONS

"Korean Application Serial No. 10-2008-7026973, Office Action mailed Dec. 28, 2013", 10 pgs.
"Korean Application Serial No. 10-2008-7026973, Preliminary Rejection mailed Jun. 25, 2013", 7 pgs.
"Korean Application Serial No. 10-2008-7026973, Response filed Aug. 26, 2013 to Office Action mailed Jun. 25, 2013", 29 pgs.
"Korean Application Serial No. 10-2008-7027075, Notice of Final Rejection mailed Dec. 10, 2013", 6 pgs.
"Korean Application Serial No. 10-2008-7027075, Response filed Jul. 31, 2013 to Office Action mailed May 16, 2013", 20 pgs.
"Korean Application Serial No. 10-2008-7027077, Notice of Preliminary Rejection mailed Jun. 7, 2013", 12 pgs.
"Korean Application Serial No. 10-2008-7027077, Response filed Aug. 7, 2013 to Office Action mailed Jun. 7, 2013", 17 pgs.

* cited by examiner

US 8,823,006 B2

NANOFIN TRANSISTORS WITH CRYSTALLINE SEMICONDUCTOR FINS

PRIORITY APPLICATION

This Application is a divisional of U.S. application Ser. No. 11/397,358, filed Apr. 4, 2006, which is incorporated herein by reference in its entirety.

CROSS REFERENCE TO RELATED APPLICATIONS

This application is related to the following commonly assigned U.S. patent applications which are herein incorporated by reference in their entirety: "Nanowire Transistor With Surrounding Gate," U.S. application Ser. No. 11/397,527, filed on Apr. 4, 2006, now issued as U.S. Pat. No. 7,425,491; "Grown Nanofin Transistors," U.S. application Ser. No. 11/397,430, filed on Apr. 4, 2006; "DRAM With Nanofin Transistors," U.S. application Ser. No. 11/397,413, filed on Apr. 4, 2006, now issued as U.S. Pat. No. 7,491,995; and "Tunneling Transistor With Sublithographic Channel," U.S. application Ser. No. 11/397,406, filed on Apr. 4, 2006.

TECHNICAL FIELD

This disclosure relates generally to semiconductor devices, and more particularly, to nanofin transistors.

BACKGROUND

The semiconductor industry has a market driven need to reduce the size of devices, such as transistors, and increase the device density on a substrate. Some product goals include lower power consumption, higher performance, and smaller sizes. FIG. 1 illustrates general trends and relationships for a variety of device parameters with scaling by a factor k. The continuous scaling of MOSFET technology to the deep sub-micron region where channel lengths are less than 0.1 micron (100 nm or 1000 Å) causes significant problems in the conventional transistor structures. For example, junction depths should be much less than the channel length. Thus, with reference to the transistor 100 illustrated in FIG. 1, the junctions depths 101 should be on the order of a few hundred Angstroms for channels lengths 102 that are approximately 1000 Å long. Such shallow junctions are difficult to form by conventional implantation and diffusion techniques. Extremely high levels of channel doping are required to suppress short-channel effects such as drain induced barrier lowering, threshold voltage roll off, and sub-threshold conduction. Sub-threshold conduction is particularly problematic in DRAM technology as it reduces the charge storage retention time on the capacitor cells. These extremely high doping levels result in increased leakage and reduced carrier mobility. Thus, the expected improved performance attributed to a shorter channel is negated by the lower carrier mobility and higher leakage attributed to the higher doping.

Leakage current is a significant issue in low voltage and lower power battery-operated CMOS circuits and systems, and particularly in DRAM circuits. The threshold voltage magnitudes are small to achieve significant overdrive and reasonable switching speeds. However, as illustrated in FIG. 2, the small threshold results in a relatively large sub-threshold leakage current.

Some proposed designs to address this problem use transistors with ultra-thin bodies, or transistors where the surface space charge region scales as other transistor dimensions scale down. Dual-gated or double-gated transistor structures also have been proposed to scale down transistors. As commonly used in the industry, "dual-gate" refers to a transistor with a front gate and a back gate which can be driven with separate and independent voltages, and "double-gated" refers to structures where both gates are driven when the same potential. An example of a double-gated device structure is the FinFET. "TriGate" structures and surrounding gate structures have also been proposed. In the "TriGate" structure, the gate is on three sides of the channel. In the surrounding gate structure, the gate surrounds or encircles the transistor channel. The surrounding gate structure provides desirable control over the transistor channel, but the structure has been difficult to realize in practice.

FIG. 3 illustrates a dual-gated MOSFET with a drain, a source, and front and back gates separated from a semiconductor body by gate insulators, and also illustrates an electric field generated by the drain. Some characteristics of the dual-gated and/or double-gated MOSFET are better than the conventional bulk silicon MOSFETs, because compared to a single gate, the two gates better screen the electric field generated by the drain electrode from the source-end of the channel. The surrounding gate further screens the electric field generated by the drain electrode from the source. Thus, sub-threshold leakage current characteristics are improved, because the sub-threshold current is reduced more quickly as the gate voltage is reduced when the dual-gate and/or double gate MOSFET turns off. FIG. 4 generally illustrates the improved sub-threshold characteristics of dual gate, double-gate, or surrounding gates MOSFETs in comparison to the sub-threshold characteristics of conventional bulk silicon MOSFETs.

FIGS. 5A-C illustrate a conventional FinFET. FIG. 5A illustrates a top view of the FinFET and FIG. 5B illustrates an end view of the FinFET along line 5B-5B. The illustrated FinFET 503 includes a first source/drain region 504, a second source/drain region 505, and a silicon fin 506 extending between the first and second source/drain regions. The silicon fin functions as a transistor body, where the channel between the first and second source/drain regions is horizontal. A gate insulator 507, such as silicon oxide, is formed over the fin, and a gate 508 is formed over the fin after the oxide is formed thereon. The fin of the illustrated conventional FinFET is formed over buried oxide 509. FIG. 5C illustrates a conventional etch technique for fabricating the fin for the FINFET. As illustrated in FIG. 5C, the fin width is defined by photolithography or e-beam lithography and etch. Thus, the fin width is initially a minimum feature size (1F). The width of the fin is subsequently reduced by oxidation or etch, as illustrated by arrows 510.

SUMMARY

Aspects of the present subject matter use a sidewall spacer technique to etch ultrathin nanofins into a wafer, and fabricate nanofin transistors with surrounding gates using these etched nanofins. Various embodiments etch silicon nanofins in a silicon substrate. The silicon nanofins are used as the body regions of CMOS transistors where both the thickness of the body of the transistor and channel length have dimensions smaller than lithographic dimensions. For example, some embodiments provide ultrathin nanofins with a thickness on the order of 20 nm to 50 nm.

One aspect of the present subject matter relates to a method for forming a transistor. According to an embodiment, a fin is formed from a crystalline substrate. A first source/drain region is formed in the substrate beneath the fin. A surrounding gate insulator is formed around the fin. A surrounding gate is formed around the fin and separated from the fin by the surrounding gate insulator. A second source/drain region is formed in a top portion of the fin. Various embodiments etch a hole in a layer over the substrate, form sidewall spacers in the hole, form a fin pattern from the sidewall spacers, and etch into the crystalline substrate to form the fin from the substrate using a mask corresponding to the fin pattern.

An aspect relates to a transistor. A transistor embodiment includes a crystalline substrate with trenches etched therein to form a crystalline semiconductor fin from the substrate, a first source/drain region formed in the crystalline substrate at a bottom of the fin and a second source/drain region formed in a top portion of the fin to define a vertically-oriented channel region in the fin between the first and second source/drain regions. The transistor also includes a gate insulator formed around the fin, and a surrounding gate formed around and separated from the fin by the gate insulator. The fin has a cross-sectional dimension that is less than a minimum feature size.

These and other aspects, embodiments, advantages, and features will become apparent from the following description of the present subject matter and the referenced drawings.

DETAILED DESCRIPTION

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive as aspects of one embodiment can be combined with aspects of another embodiment. Other embodiments may be utilised and structural, logical, and electrical changes may be made without departing from the scope of the present subject matter. In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side", "higher", "lower", "over " and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Disclosed herein are nanofin transistors, and a fabrication technique in which nanofins are etched into a substrate or wafer and used to make single crystalline nanofin transistors. The following discussion refers to a silicon nanofin embodiment. Those of ordinary skill in the art will understand, upon reading and comprehending this disclosure, how to form nanofins using other semiconductors. Aspects of the present subject matter provide nanofin transistors with vertical channels, where there is a first source/drain region at the bottom of the fin and a second source/drain region at the top of the fin. FIGS. 6A-6L illustrate a process for forming a nanofin transistor, according to various embodiments of the present subject matter.

Figure 1:
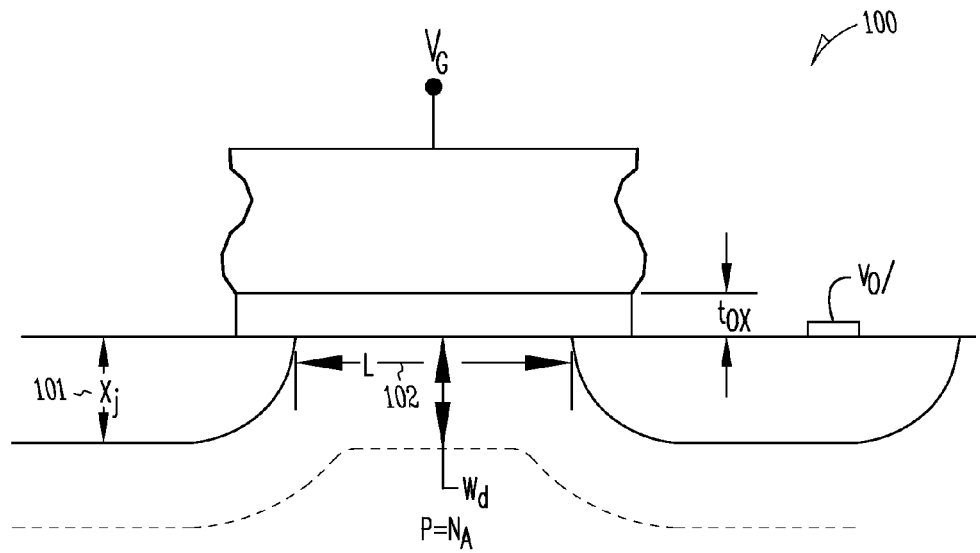
FIG. 1 illustrates general trends and relationships for a variety of device parameters with scaling by a factor k.
Figure 2:
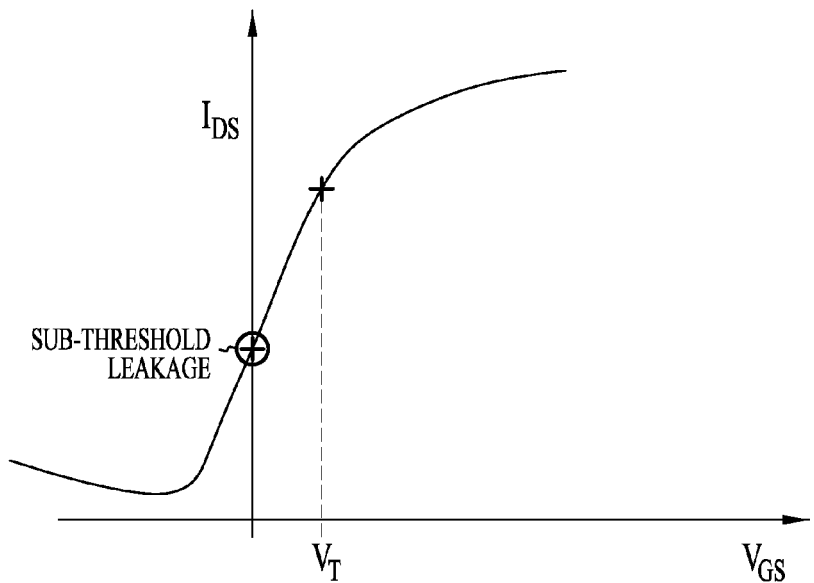
FIG. 2 illustrates sub-threshold leakage in a conventional silicon MOSFET.
Figure 3:
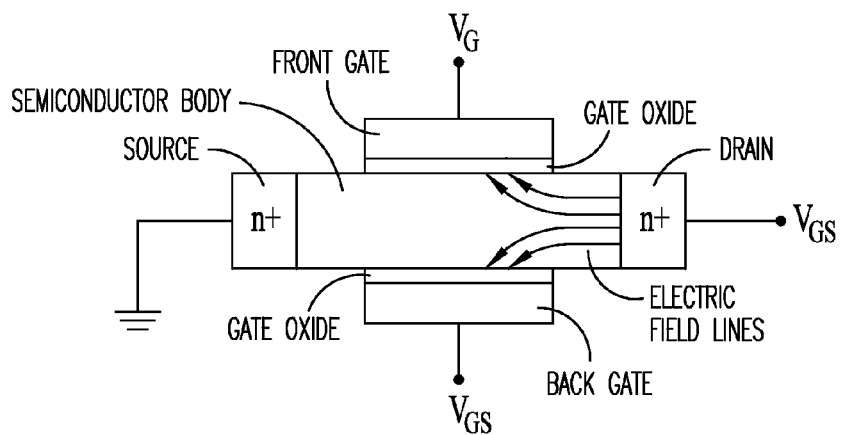
FIG. 3 illustrates a dual-gated MOSFET with a drain, a source, front and back gates separated from a semiconductor body by gate insulators, and an electric field generated by the drain.
Figure 4:
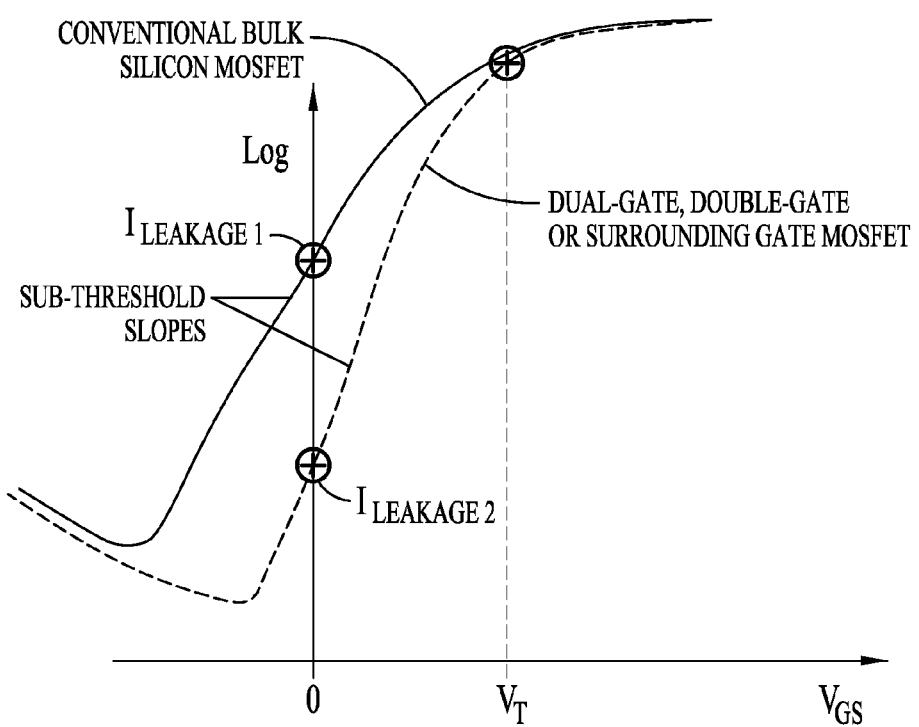
FIG. 4 generally illustrates the improved sub-threshold characteristics of dual gate, double-gate, and surrounding gate MOSFETs in comparison to the sub-threshold characteristics of conventional bulk silicon MOSFETs.
Figure 5A:
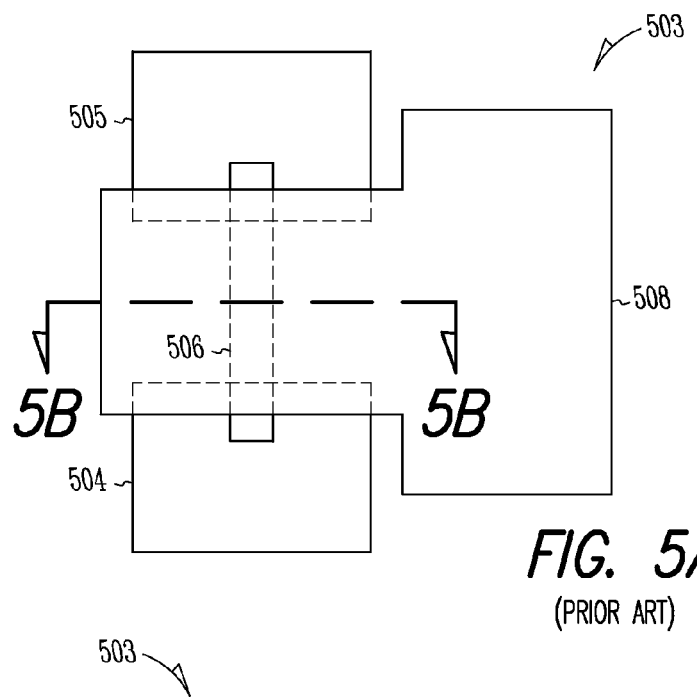
FIGS. 5A-C illustrate a conventional FINFET.
Figure 5B:
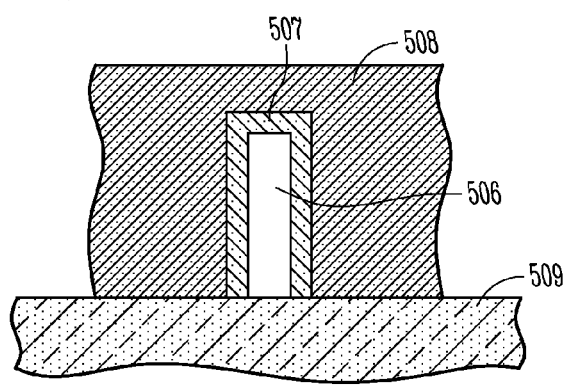
Figure 5C:
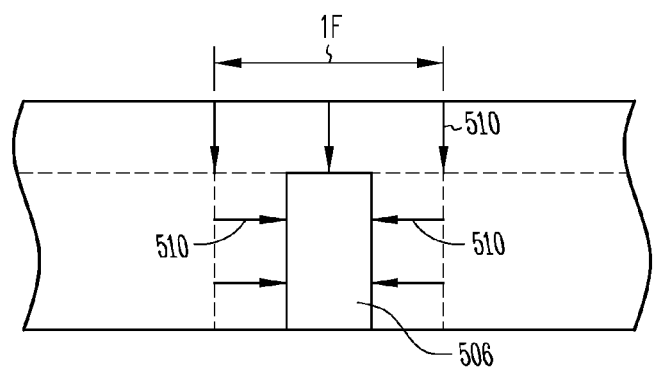
Figure 6A:
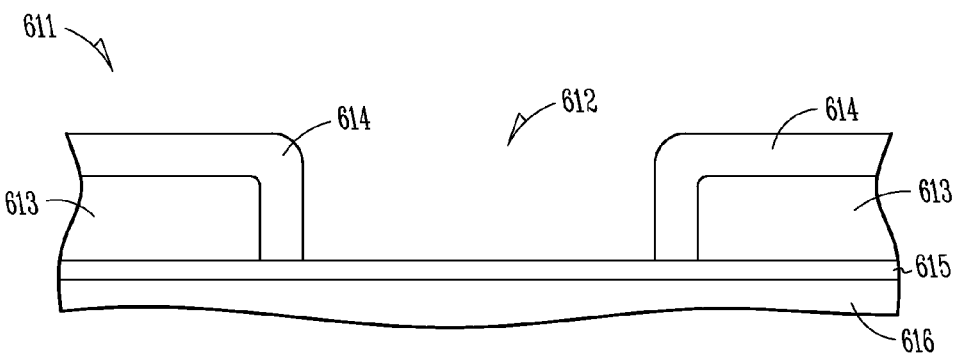
FIGS. 6A-6L illustrate a process for forming a nanofin transistor, according to various embodiments of the present subject matter.
Figure 6B:
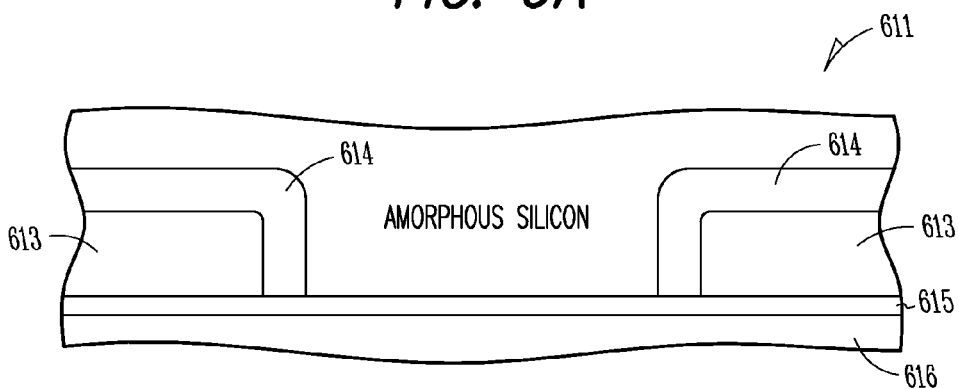
Figure 6C:
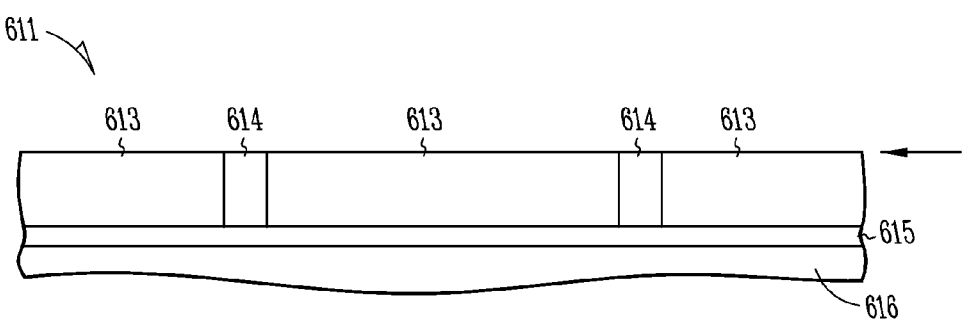

Silicon nitride is deposited on a silicon wafer, and the silicon nitride is covered with a layer of amorphous silicon (a-silicon). FIG. 6A illustrates a side view of the structure 611 after holes 612 are defined in the amorphous silicon 613 and sidewall spacers 614 are formed. The holes 612 extend to the silicon nitride layer 615, which lies over a substrate 616 such as a silicon wafer. Various embodiments form the sidewall spacers by oxidizing the amorphous silicon. FIG. 6B illustrates a side view of the structure 611, after the structure is covered with a thick layer of amorphous silicon. FIG. 6C illustrates the structure 611 after the structure is planarized, illustrated by the arrow, at least to a level to remove the oxide on top of the amorphous silicon. The structure can be planarized using a chemical mechanical polishing (CMP) process, for example. This leaves an elongated rectangular pattern, also referred to as a "racetrack" pattern, of oxide 614 exposed on the surface. The width of the pattern lines is determined by the oxide thickness rather than masking and lithography. For example, the oxide thickness can be within a range on the order of 20 nm to 50 nm, according to various embodiments.

Figure 6D:
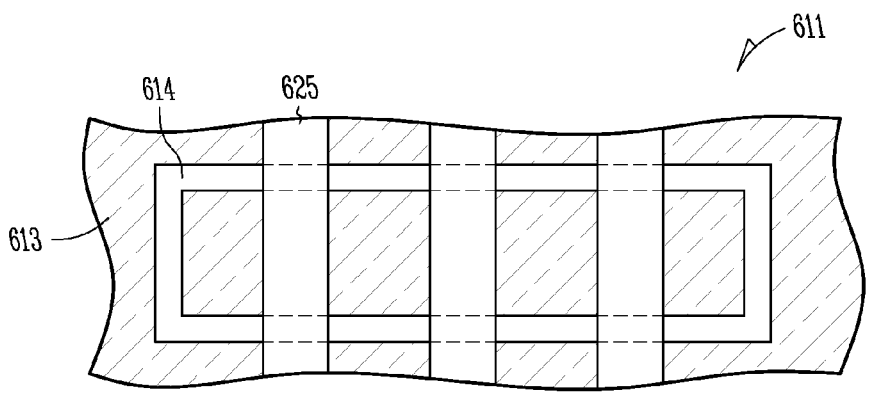
Figure 6E:
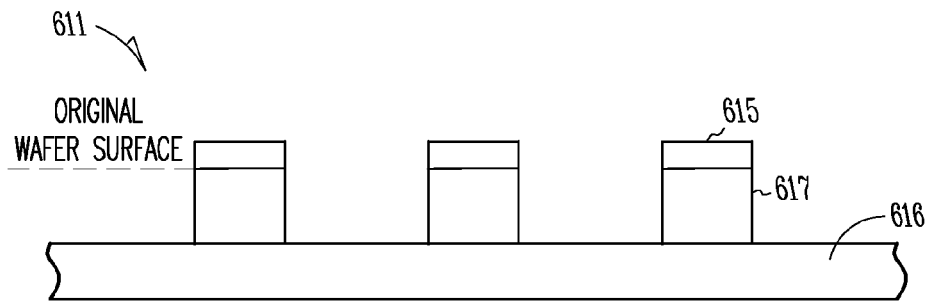
Figure 6F:
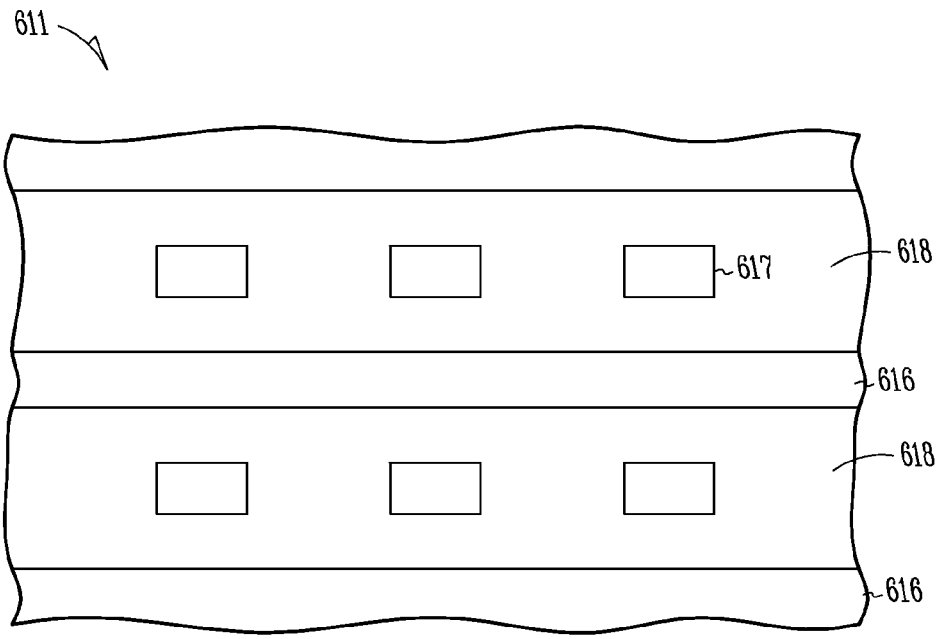
Figure 6G:
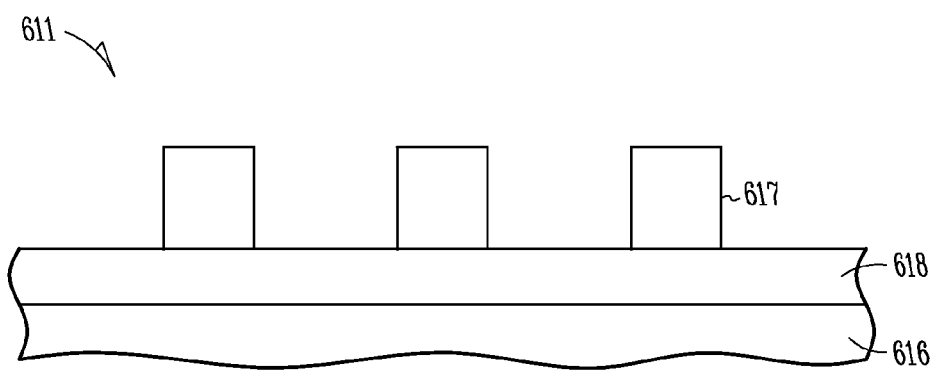

FIG. 6D illustrates a mask (a mask pattern) 625 over the racetrack pattern 614, which selectively covers portions of the oxide and exposes other portions of the oxide. The exposed oxide portions are removed. An etch process, such as a potassium hydroxide (KOH) etch, is performed to remove the amorphous silicon. The oxide, or the portions of the oxide remaining after the mask and etch illustrated in FIG. 6D, protects the nitride during the etch. After the amorphous silicon is removed the nitride 615 can be etched, followed by a directional silicon etch that etches the wafer 616 to a predetermined depth below the nitride layer. The nitride pattern protects the local areas of silicon from the etch, resulting in silicon fins 617 of silicon (an array of sidewall spacers) protruding from the now lower surface of the silicon wafer, as illustrated in FIG. 6E. FIGS. 6F and 6G illustrate top and side views of the structure, after the tops of the fins and trenches at the bottom of the fins are implanted with a dopant. As illustrated in FIG. 6F, the dopant in the trench forms a conductive line 618 (e.g. source line). The dopant also forms a source/drain region at the bottom or a bottom portion of the fin. Because the fins are extremely thin, the doping in the trench is able to diffuse completely under the fins. The strips can be in either the row or column direction.

Figure 6H:
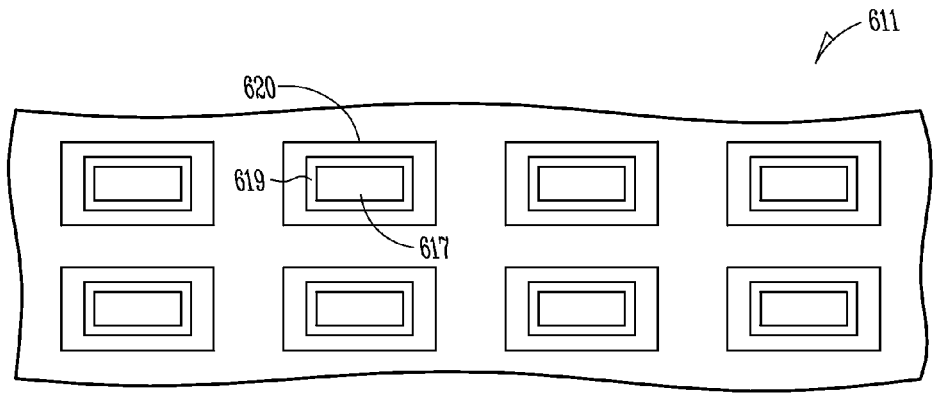

FIG. 6H illustrates the structure 611 after a gate insulator 619 has been formed around the fin 617, and a gate material 620 is formed around and separated from the fin by the gate insulator. For example, an embodiment oxidizes the silicon fins using a thermal oxidation process. The gate material 620 may be polysilicon or metal, according to various embodiments.

Figure 6I:
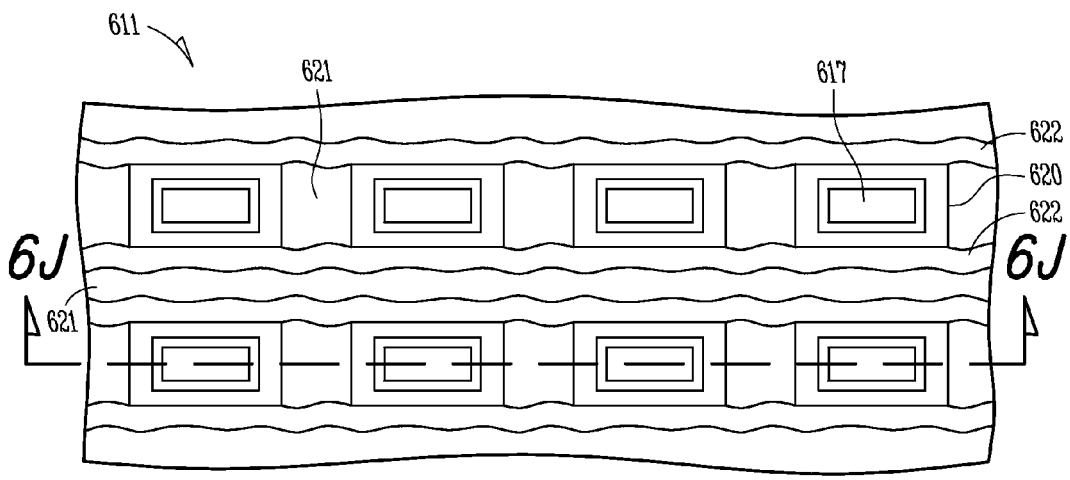
Figure 6J:
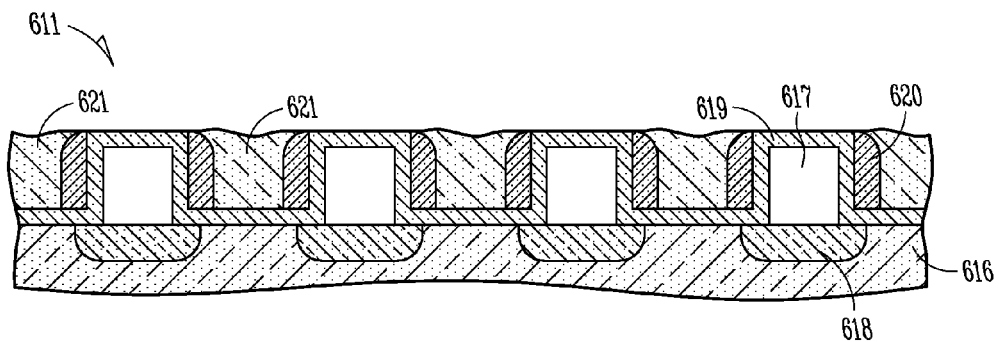

FIGS. 6I and 6J illustrate a top view and a cross-section view along line 6J-6J, respectively, of a first array embodiment. The structure 611 is backfilled with an insulator 621 (e.g. oxide) and trenches are created on the sides of the fins. Gate wiring material 622, such as polysilicon or metal, can be deposited and directionally etched to leave on the sidewalls only and contacting the surrounding gates 620 for the fins. The gate material and gate wiring material can be etched to recess it below the tops of the fins. The whole structure can be again backfilled with oxide and planarized to leave only oxide on the surface. Contact openings and drain doping regions can then be etched to the top of the pillars and drain regions implanted and metal contacts to the drain regions made by conventional techniques. In this case, the metal wiring could run in the "x-direction" and the buried source wiring could run perpendicular to the plane of the paper in the illustration.

Figure 6K:
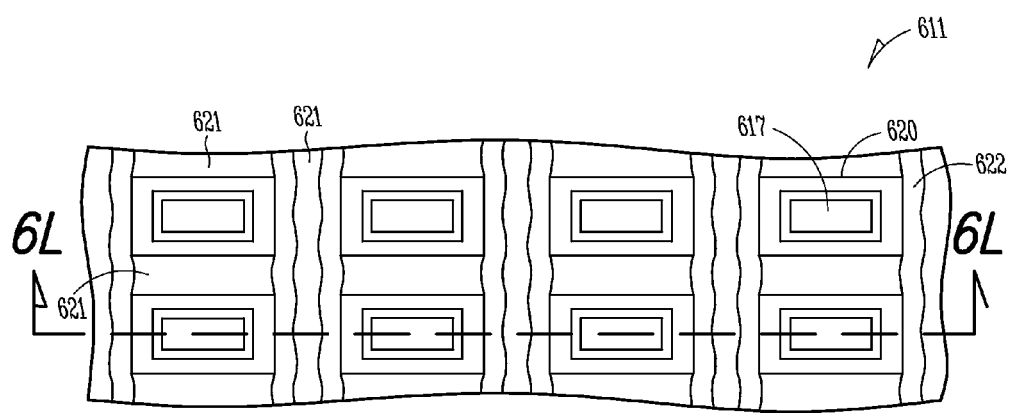
Figure 6L:
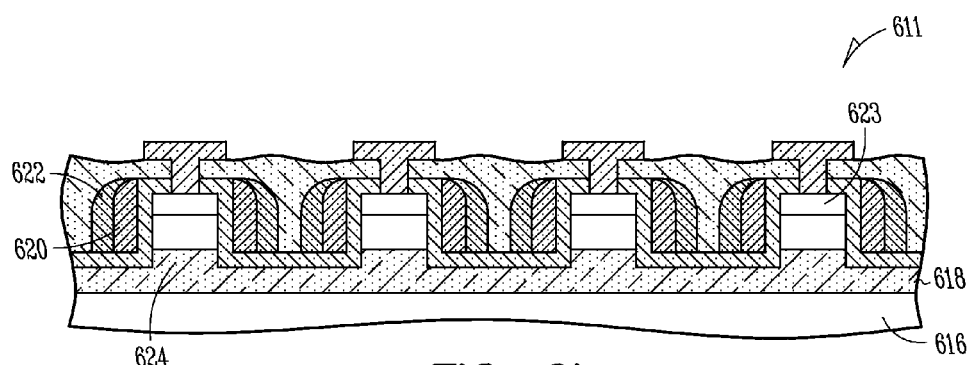

FIGS. 6K and 6L illustrate a top view and a cross-section view along 6L-6L, respectively, of a second array embodiment. The structure 611 is backfilled with an insulator 621 (e.g. oxide) and trenches are created along the side of the fins 617, in the "y-direction". Gate wiring material 622, such as polysilicon or metal, can be deposited and directionally etched to leave on the sidewalls only and contacting the gates on the fins. The gate material and gate wiring material can be etched to recess it below the tops of the fins. The whole structure can be backfilled with an insulator (e.g. oxide) and planarized to leave only oxide on the surface. Contact openings and drain doping regions can then be etched to the top of the pillars and drain regions implanted and metal contacts to the drain regions made by conventional techniques. In this case, the metal wiring could run perpendicular to the plane of the paper in the illustration and the buried source wiring could run in the "x-direction".

In both the first and second array embodiments, the buried source/drains can be implanted before the formation of the surrounding gate insulator and surrounding gate. FIG. 6L illustrates one of the completed fin structures with drain/source regions 623 and 624, recessed gates 620, and source/drain region wiring 618. These nanofin FET's can have a large W/L ratio and will conduct more current than nanowire FET's.

Figure 7:
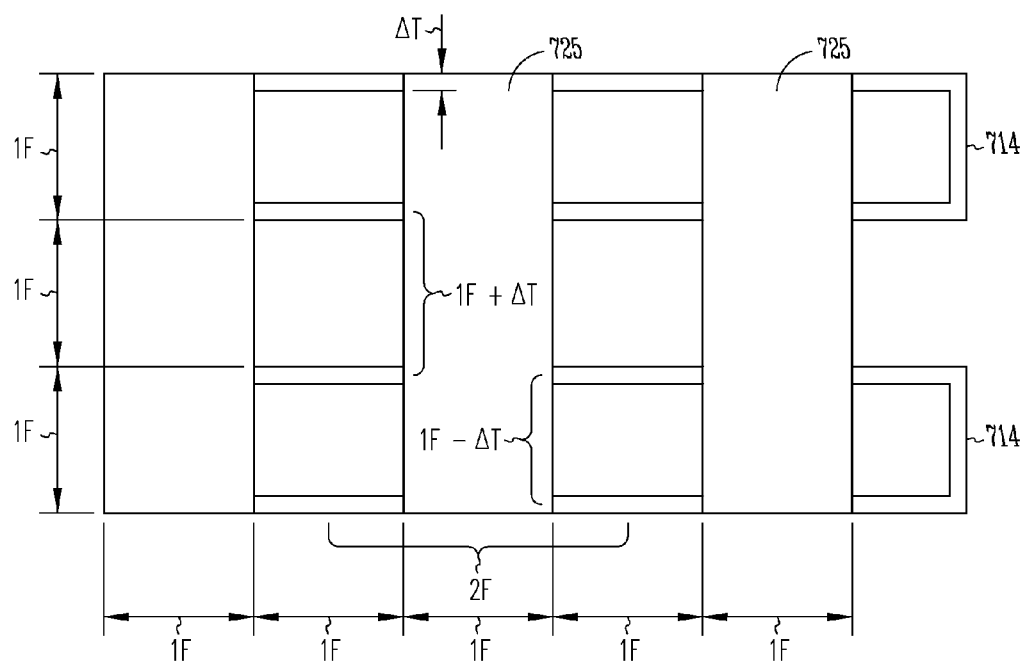
FIG. 7 illustrates a top view of a layout of nanofins for an array of nanofin transistors, according to various embodiments.

FIG. 7 illustrates a top view of a layout of nanofins for an array of nanofin transistors, according to various embodiments. The figure illustrates two "racetracks" of sidewall spacers 714, and further illustrates the portions of the sidewall spacers removed by an etch. The holes used to form the sidewall spacer tracks were formed with a minimum feature size (1F). The mask strips 725 have a width of a minimum feature size (1F) and are separated by a minimum feature size (1F). In the illustrated layout, the columns of the nanofins have an approximately 2F center-to-center spacing, and the rows of the nanofins have an approximately (1F) center-to-center spacing. Also, as illustrated in FIG. 7, since the nanofins are formed from sidewall spacers on the walls of the holes, the center-to-center spacing between first and second rows will be slightly less than 1F size by an amount corresponding to the thickness of the nanofins (1F−ΔT), and the center-to-center spacing between second and third rows will be slightly more than (1F) by an amount corresponding to the thickness of the nanofins (1F+ΔT).

Figure 8:
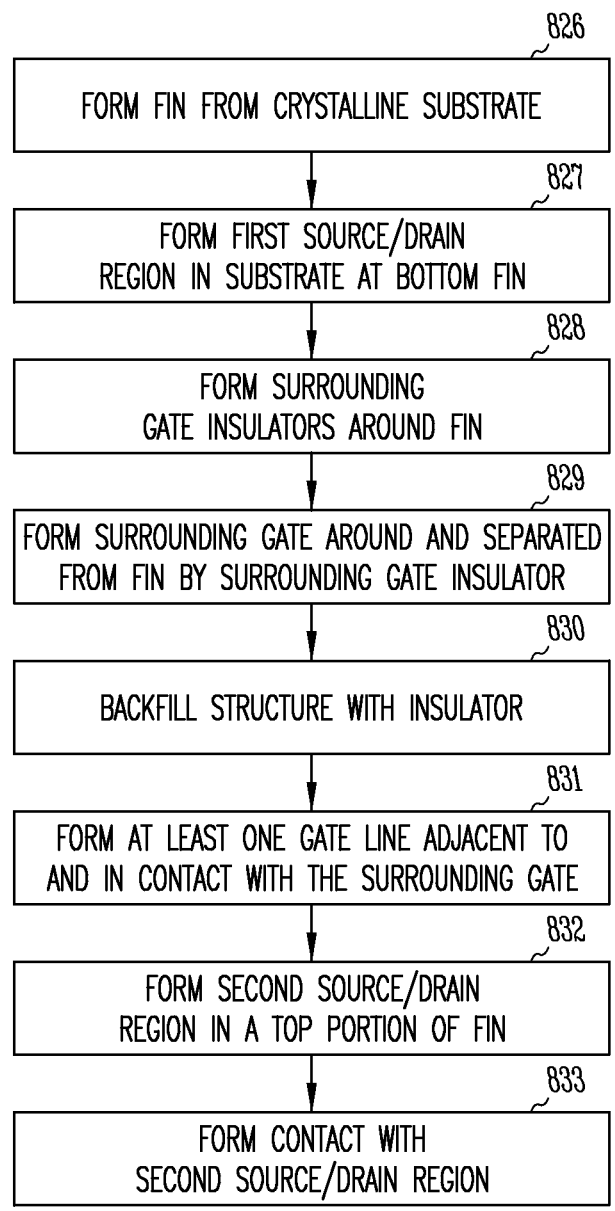
FIG. 8 illustrates a process to fabricate a nanofin transistor, according to various embodiments of the present subject matter.

FIG. 8 illustrates a process to fabricate a nanofin transistor, according to various embodiments of the present subject matter. At 826, a fin is formed from a crystalline substrate. For example, the fins can be etched from a wafer, such as a silicon wafer. At 827, a first source/drain region is formed in the substrate at the bottom of the fins. Because the fin is thin, the dopant is able to diffuse underneath the entire footprint of the fin. At 828, a surrounding gate insulator is formed around the fin; and at 829, surrounding gate is formed around and separated from the fin by surrounding the gate insulators. The resulting structure is backfilled with an insulator at 830. Trench(es) are etched and gate line(s) are formed adjacent to and in contact with the surrounding gate, as illustrated at 831. Some embodiments form two gate lines in contact with opposite sides of the surrounding gate. The gate lines can be oriented to contact the surrounding gate on a long side of the nanofin structure, or can be oriented to contact the surrounding gate on a short side of the nanofin structure. That is, the gate line(s) can be formed in the column or row directions. At 832, a second source/drain region is formed in a top portion of the fins, and contacts for the second source/drain regions are formed at 833.

Figure 9:
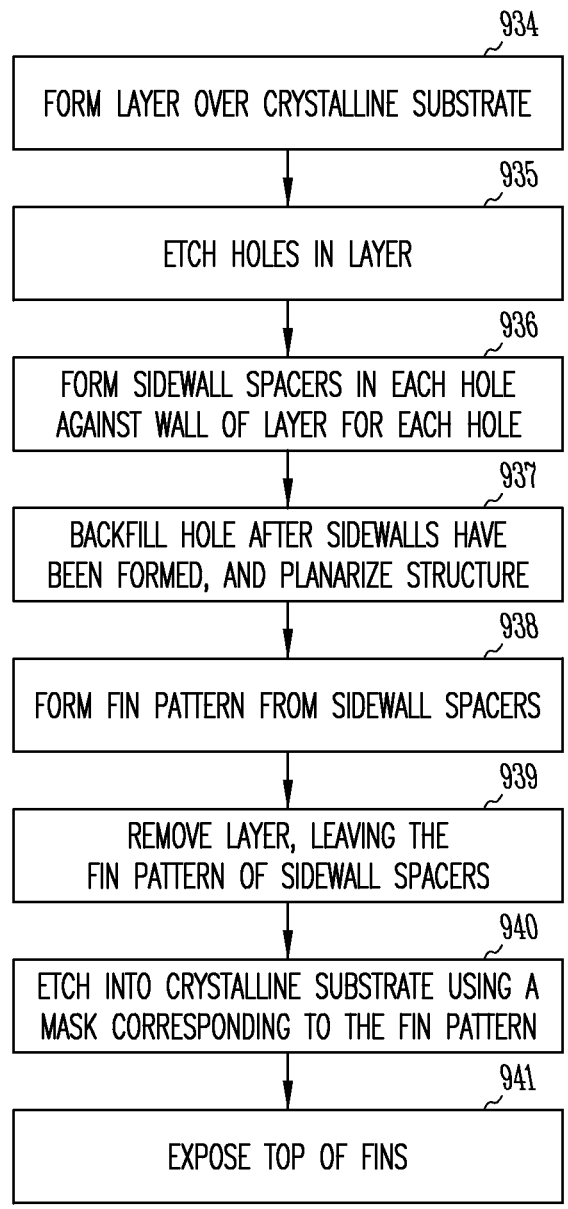
FIG. 9 illustrates a process to form a fin from a crystalline substrate, according to various embodiments of the present subject matter.

FIG. 9 illustrates a process to form a fin from a crystalline substrate, such as illustrated at 826 in FIG. 8, according to various embodiments of the present subject matter. A layer is formed over the crystalline substrate at 934, and holes are etched or otherwise formed in the layer at 935. In various embodiments, the layer formed over the crystalline substrate is a layer of amorphous silicon, with a layer of silicon nitride sandwiched between the crystalline substrate and the amorphous silicon, and a hole is etched to the layer of silicon nitride. At 936, sidewall spacers are formed in the hole against a wall of the layer that defines the periphery of the hole. Various embodiments oxidize the amorphous silicon layer to form the sidewall spacers. The hole is backfilled with the material of the first layer (e.g. a-silicon), and the structure is planarized at 937. In the embodiment illustrated in FIGS. 6B and 6C, the planarization removes the oxide on the top surface of the amorphous silicon, leaving a "racetrack" or rectangular pattern of oxide sidewall spacers. At 938, a fin pattern is formed from the sidewall spacers, such as may be realized using a mask and etch process, for example. In some embodiments, the resulting fin pattern has a first cross-section thickness in a first direction that corresponds to a minimum feature size, and a second cross-section thickness in a second direction orthogonal to the first that corresponds to the thickness of the oxide sidewalls and is significantly less than the minimum feature size. At 939, the layer (e.g. a-silicon) is removed, leaving the fin pattern of sidewall spacers. The crystalline substrate is etched at 940 using a mask corresponding to the fin pattern of sidewall spacers. Various embodiments etch the silicon nitride layer into fin pattern, and then use the silicon nitride layer to mask the crystalline substrate with the fin pattern when the substrate is etched. At 941, the mask layer (e.g. silicon nitride) is removed to expose the top of the etched fins.

Figure 10:
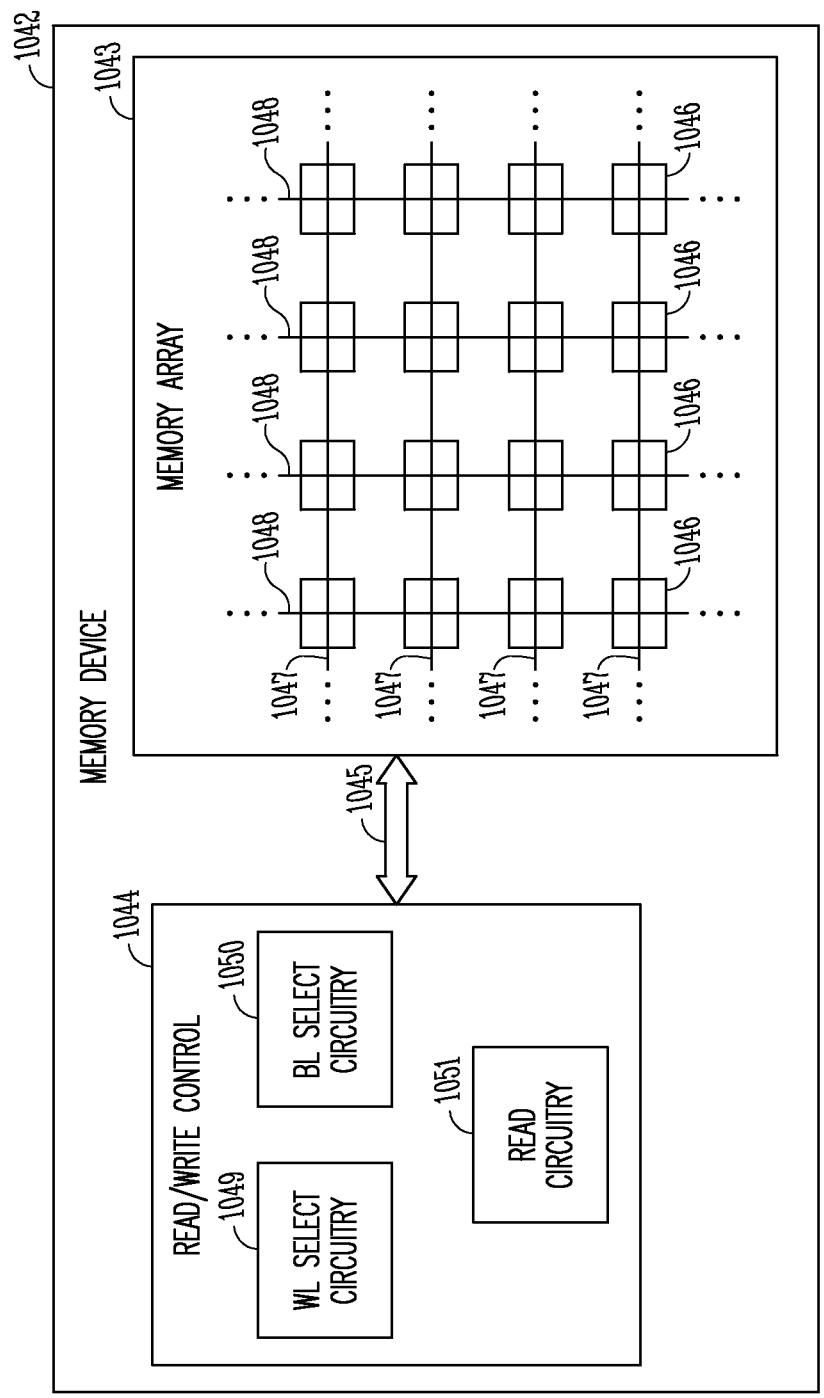
FIG. 10 is a simplified block diagram of a high-level organization of various embodiments of a memory device according to various embodiments of the present subject matter.

FIG. 10 is a simplified block diagram of a high-level organization of various embodiments of a memory device according to various embodiments of the present subject matter. The illustrated memory device 1042 includes a memory array 1043 and read/write control circuitry 1044 to perform operations on the memory array via communication line(s) or channel(s) 1045. The illustrated memory device 1042 may be a memory card or a memory module such as a single inline memory module (SIMM) and dual inline memory module (DIMM). One of ordinary skill in the art will understand, upon reading and comprehending this disclosure, that semiconductor components in the memory array and/or the control circuitry are able to be fabricated using etched nanofin transistors, as described above. The structure and fabrication methods for these devices have been described above.

The memory array 1043 includes a number of memory cells 1046. The memory cells in the array are arranged in rows and columns. In various embodiments, word lines 1047 connect the memory cells in the rows, and bit lines 1048 connect the memory cells in the columns. The read/write control circuitry 1044 includes word line select circuitry 1049 which functions to select a desired row, bit line select circuitry 1050 which functions to select a desired column, and read circuitry 1051, which functions to detect a memory state for a selected memory cell in the memory array 1043.

Figure 11:
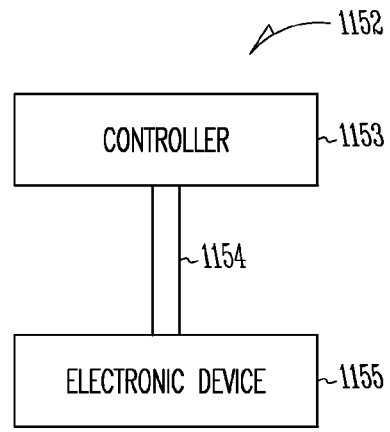
FIG. 11 illustrates a diagram for an electronic system having one or more nanofin transistors, according to various embodiments.

FIG. 11 illustrates a diagram for an electronic system 1152 having one or more nanofin transistors, according to various embodiments. Electronic system 1152 includes a controller 1153, a bus 1154, and an electronic device 1155, where the bus 1154 provides communication channels between the controller 1153 and the electronic device 1155. In various embodiments, the controller and/or electronic device include nanofin transistors as previously discussed herein. The illustrated electronic system 1152 may include, but is not limited to, information handling devices, wireless systems, telecommunication systems, fiber optic systems, electro-optic systems, and computers.

Figure 12:
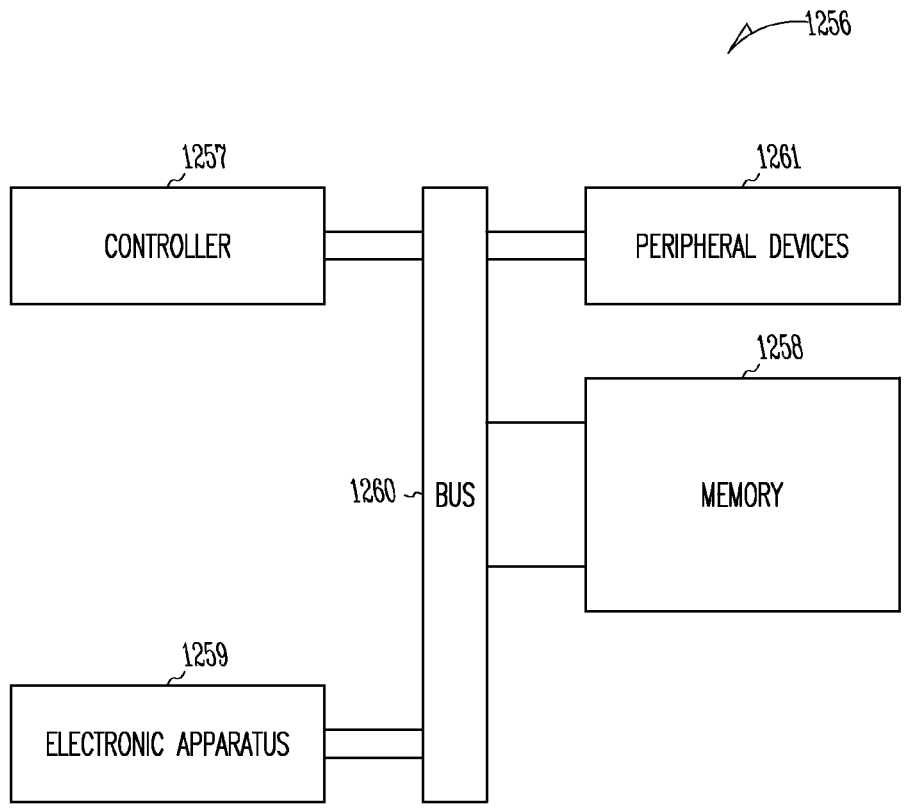
FIG. 12 depicts a diagram of an embodiment of a system having a controller and a memory.

FIG. 12 depicts a diagram of an embodiment of a system 1256 having a controller 1257 and a memory 1258. The controller and/or memory may include nanofin transistors according to various embodiments. The illustrated system 1256 also includes an electronic apparatus 1259 and a bus 1260 to provide communication channel(s) between the controller and the electronic apparatus, and between the controller and the memory. The bus may include an address, a data bus, and a control bus, each independently configured; or may use common communication channels to provide address, data, and/or control, the use of which is regulated by the controller. In an embodiment, the electronic apparatus 1259 may be additional memory configured similar to memory 1258. An embodiment may include a peripheral device or devices 1261 coupled to the bus 1260. Peripheral devices may include displays, additional storage memory, or other control devices that may operate in conjunction with the controller and/or the memory. In an embodiment, the controller is a processor. Any of the controller 1257, the memory 1258, the electronic apparatus 1259, and the peripheral devices 1261 may include nanofin transistors according to various embodiments. The system 1256 may include, but is not limited to, information handling devices, telecommunication systems, and computers. Applications containing nanofin transistors as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The memory may be realized as a memory device containing nanofin transistors according to various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM). Various emerging memory technologies are capable of using transistors with the compressively-strained channels.

This disclosure includes several processes, circuit diagrams, and cell structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing and understanding the above description. The scope of the present subject matter should be determined with reference to the appended claims, along with the full scope of equivalents to which such claims are entitled.

What is claimed is:

1. A semiconductor structure, comprising:
   a crystalline substrate, with trenches etched therein to form at least three crystalline semiconductor fins from the substrate, wherein each of the at least three crystalline semiconductor fins has a cross-sectional dimension that is less than a minimum feature size (F), and wherein for each of the at least three crystalline semiconductor fins the respective fin includes:
   a first source/drain region in the crystalline substrate at a bottom of the fin, and a second source/drain region in a top portion of the fin to define a vertically-oriented channel region in the fin between the first and second source/drain regions;
   a gate insulator formed around the fin; and
   a surrounding gate formed around and separated from the fin by the gate insulator; and
   the at least three crystalline semiconductor fins including a first fin, a second fin, and a third fin, wherein the second fin is between the first and third fins, the first and second fins have a center-to-center spacing of the minimum feature size (F) less the cross-sectional dimension of the fins ($\Delta T$), and the second fin and the third fin have a center-to center spacing of the minimum feature size (F) plus the cross-sectional dimension of the fins ($\Delta T$).

2. The structure of claim 1, wherein the crystalline substrate includes silicon.

3. The structure of claim 1, wherein the crystalline substrate is a crystalline silicon wafer.

4. The structure of claim 1, wherein the surrounding gate insulator includes silicon oxide.

5. The structure of claim 1, wherein the surrounding gate includes polysilicon.

6. The structure of claim 1, wherein the surrounding gate includes metal.

7. A transistor, comprising:
a crystalline silicon wafer, with trenches etched therein to form at least three crystalline semiconductor fins from the wafer, wherein each of the at least three crystalline semiconductor fins has a cross-sectional dimension in a first direction that is less than a minimum feature size (F) and a cross-sectional dimension in a second direction orthogonal to the first direction that corresponds to the minimum feature size (F), and wherein for each of the at least three crystalline semiconductor fins the respective fin includes:
a first source/drain region in the crystalline wafer at a bottom of the fin, and a second source/drain region in a top portion of the fin to define a vertically-oriented channel region in the fin between the first and second source/drain regions;
a gate insulator formed around the fin; and
a surrounding gate formed around and separated from the fin by the gate insulator; and
the at least three crystalline semiconductor fins including a first fin, a second fin, and a third fin, wherein the second fin is between the first and third fins, the first and second fins have a center-to-center spacing of the minimum feature size (F) less the cross-sectional dimension of the fins ($\Delta T$) in the first direction, and the second fin and the third fin have a center-to center spacing of the minimum feature size (F) plus the cross-sectional dimension of the fins ($\Delta T$) in the first direction.

8. The transistor of claim 7, wherein the gate insulator includes a silicon oxide.

9. The transistor of claim 8, wherein the silicon oxide gate insulator is thermally-grown silicon oxide.

10. The transistor of claim 7, wherein the surrounding gate includes a polysilicon surrounding gate.

11. The transistor of claim 7, wherein the surrounding gate includes a metal surrounding gate.

12. A semiconductor structure, comprising:
an array of transistors arranged in columns and rows, each transistor in the array including a first source/drain region, a second source/drain region above the first source/drain region, and a vertically-oriented channel region between the first and second source/drain regions, the channel region being formed in a crystalline semiconductor fin having a cross-sectional dimension ($\Delta T$) that is less than a minimum feature size (F), the fin being formed from a crystalline wafer by etching trenches to define the fin, each transistor further including a gate insulator formed around the fin and a surrounding gate formed around and separated from the fin by the gate insulator, wherein a first row includes a first fin, an adjacent second row to the first row includes a second fin, and an adjacent third row to the second row includes a third fin such that the second fin is between the first and third fins, the first row and the second row has a center-to-center spacing of the minimum feature size (F) less the cross-sectional dimension ($\Delta T$), and the second row and the third row has a center-to-center spacing of the minimum feature size (F) plus the cross-sectional dimension ($\Delta T$) such that the first and second fins have a center-to-center spacing of the minimum feature size (F) less the cross-sectional dimension ($\Delta T$), and the second fin and the third fin have a center-to center spacing of the minimum feature size (F) plus the cross-sectional dimension ($\Delta T$).

13. The structure of claim 12, further comprising at least one gate line along the fins in contact with the surrounding gate.

14. The structure of claim 13, wherein the fin has a rectangular cross-section with a long side and a short side, and the at least one gate line contacts the surrounding gate on the short side.

15. The structure of claim 13, wherein the fin has a rectangular cross-section with a long side and a short side, and the at least one gate line contacts the surrounding gate on the long side.

16. The structure of claim 13, wherein the at least one gate line includes two gate lines on opposing sides of the fins.

17. The structure of claim 12, wherein the crystalline wafer includes a crystalline silicon wafer.

18. The structure of claim 12, wherein the surrounding gate insulator includes silicon oxide.

19. The structure of claim 12, wherein the surrounding gate includes polysilicon.

20. The structure of claim 12, wherein the surrounding gate includes metal.

* * * * *

UNITED STATES PATENT AND TRADEMARK OFFICE
CERTIFICATE OF CORRECTION

PATENT NO. : 8,823,006 B2  
APPLICATION NO. : 13/723838  
DATED : September 2, 2014  
INVENTOR(S) : Leonard Forbes Page 1 of 1

It is certified that error appears in the above-identified patent and that said Letters Patent is hereby corrected as shown below:

In the Specification

In column 1, line 19, delete "11/397,430,filed" and insert -- 11/397,430, filed --, therefor.

In column 1, line 20, delete "11/397,413,filed" and insert -- 11/397,413, filed --, therefor.

In column 1, line 23, delete "11/397,406,filed" and insert -- 11/397,406, filed --, therefor.

Signed and Sealed this
Eighteenth Day of November, 2014

Michelle K. Lee
*Deputy Director of the United States Patent and Trademark Office*